May 18, 1965 F. H. DILL 3,183,576

METHOD OF MAKING TRANSISTOR STRUCTURES

Filed June 26, 1962 2 Sheets-Sheet 1

INVENTOR
FREDERICK H. DILL

BY John F. Ohlandt Jr.
ATTORNEY

May 18, 1965 F. H. DILL 3,183,576

METHOD OF MAKING TRANSISTOR STRUCTURES

Filed June 26, 1962 2 Sheets-Sheet 2

United States Patent Office 3,183,576
Patented May 18, 1965

3,183,576
METHOD OF MAKING TRANSISTOR STRUCTURES

Frederick H. Dill, Putnam Valley, N.Y., assignor to International Business Machines Corporation, New York, N.Y., a corporation of New York Filed June 26, 1962, Ser. No. 205,368
11 Claims. (Cl. 29—25.3)

This invention relates to semiconductive devices and, in particular, to an improved method of making transistor structures.

As the semiconductor art has developed, interest has centered on the production of extremely high speed devices and, particularly, high speed transistors. In fabricating these high speed transistors, specialized geometries and techniques for achieving these geometries have received great attention. A prior-art scheme that has been employed is based upon a method of mask imaging to obtain what is known as a ring-dot geometry in the formation of base and emitter contacts to a semi-condutcor body. Briefly considered, the ring-dot geometry provides a very tiny emitter dot contact on the surface of the body with an annular ring forming the base contact and surrounding the emitter dot. The base ring and emitter dot are produced on the surface of the body by evaporating several sources of typical metals through a mask placed adjacent the semiconductor body or substrate.

A problem with the ring-dot geometry as described above, is that current crowding causes most of the emission of electrons (for the case of an N-P-N transistor) to occur around the rim of the emitter. Although the central portion of the emitter dot is relatively inactive, it still adds to the emitter capacitance. The problem cannot be obviated simply by making the emitter smaller because this introduces problems in lead attachment.

Accordingly, it is an object of the present invention to provide the desirable ring-dot geometry for base-emitter contacts but without the capacitance contributed by the conventional formation of the emitter contact.

A further problem that is introduced in the ring and dot geometry involves the tolerances. In making a ring base and dot emitter structure, it is desirable to have the emitter and base contacts as close as possible. One source of difficulty here is that the precision of placing the emitter and placing contacts is only as accurate as the dimension of the holes in the masking that is used. This accuracy is probably on the order of 0.05–0.1 mil with current masking techniques. The problem is that in the imaging used in the prior-art method, the adjacent edges of the emitter and base contacts are formed by opposite edges of the mask. Thus, irregularities in the hole in the mask will require a larger emitter-base spacing than could be obtained with perfect masks. Also, any differences in the diameter of the masks or small differences in spacing between the mask and substrate will cause the emitter-to-base spacing to either increase, or else overlap and cause shorting, even though the masks are perfect.

It is, therefore, another object of the present invention to eliminate the aforesaid tolerance problems.

In accordance with the first broad feature of the present invention, an insulator source is employed along with the emitter and base sources, and the insulator source is placed on or near the axis of rotation of the mask-substrate combination. The insulator material is evaporated through the mask, placed adjacent the substrate, so as to form an insulator deposit on the substrate. Both the emitter and base sources are situated off axis, with the emitter source being only a slightly off axis, resulting in the deposition of the emitter contact material so as to overlap the insulator deposition thereby to create a large area contact insofar as the attachment of leads are concerned, but an effectively small area contact to the semiconductor substrate, with attendant small capacitance.

In accordance with the second broad feature of the present invention, the tolerance problems heretofore mentioned are overcome by providing that the emitter-to-base spacing be determined by the evaporation of an insulator rather than by the separation of images, which separation is severely affected by the tolerances.

The foregoing and other objects, features and advantages of the invention will be apparent from the following more particular description of preferred embodiments of the invention, as illustrated in the accompanying drawings.

Figure 1:
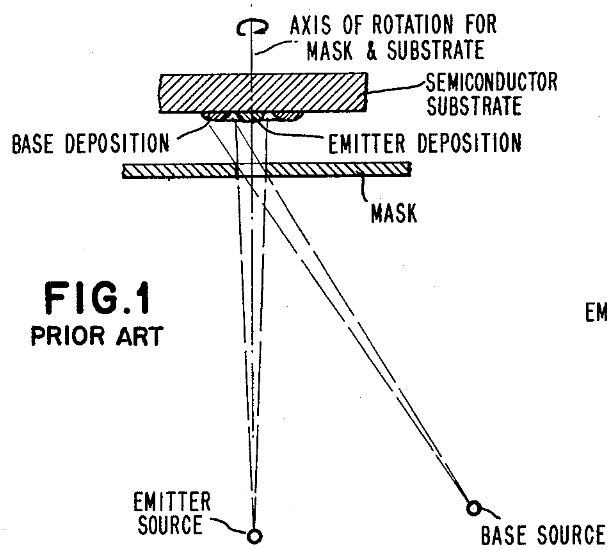
FIG. 1 PRIOR ART
FIG. 1 is a sketch including a ray diagram of the ring and dot evaporation method according to the prior art.

Referring now to FIG. 1, a sketch of a prior-art scheme is shown where base and emitter sources, shown schematically as small circles, are located in the lower portion of the figure. A semi-conductor substrate and a mask, adjacent the substrate, are positioned on or near an axis which is in line with the emitter source. Both the mask and substrate are rotated together on or near the axis of rotation shown. The mask and substrate are rotated by suitable means not shown in this figure but well known to those skilled in the art. The emitter and base sources are heated in a vacuum so as to provide exaporation of the materials constituting the emitter and base sources. Typical materials are 99% Au, 1% Ga for the emitter source and 99% Au, 1% Sb for the base source. The evaporated materials, having acquired energy due to the heating, radiate outwardly in straight-line fashion. Thus, they pass through the small aperture in the mask, which aperture is on the order of 1 mil in diameter, strike the semiconductor substrate at several points and condense thereon. The ray-like paths for the base and emitter sources through the aperture in the mask are analogous to the paths of light rays in a typical pinhole-camera arrangement.

Due to the fact that the emitter source is located on or near the axis of rotation for both the mask and substrate, the deposition of the emitter source material on the substrate will, of course, assume a dot-like shape, whereas the deposition of the base material will assume the form of a ring. The ring is formed due to the fact that at successive instants of time the base material is being deposited as a dot at a distance from the emitter deposition determined by the off-axis angle of the base source and the separation of mask and substrate.

Figure 1A:
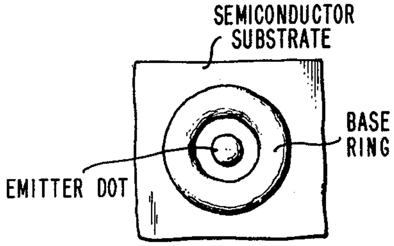
FIG. 1A PRIOR ART
FIG. 1A is a view depicting the bare ring and emitter dot configuration formed in accordance with the prior-art method.

Referring now to FIG. 1A, the completed configuration resulting from the prior-art procedure is illustrated. As referred to hereinbefore, current crowding causes most of the emission of carriers to occur around the rim of the emitter dot shown in FIG. 1A. This emitter dot typically has an area on the order of 2 mils$^2$. This current crowding referred to occurs in an area of approximately ½ of the total. Thus, although ½ of the area is less effective, insofar as emission of carriers in accordance with standard transistor operation is concerned, the total area of the dot which is in contact with the semiconductor substrate contributes to the capacitance.

Figure 2:
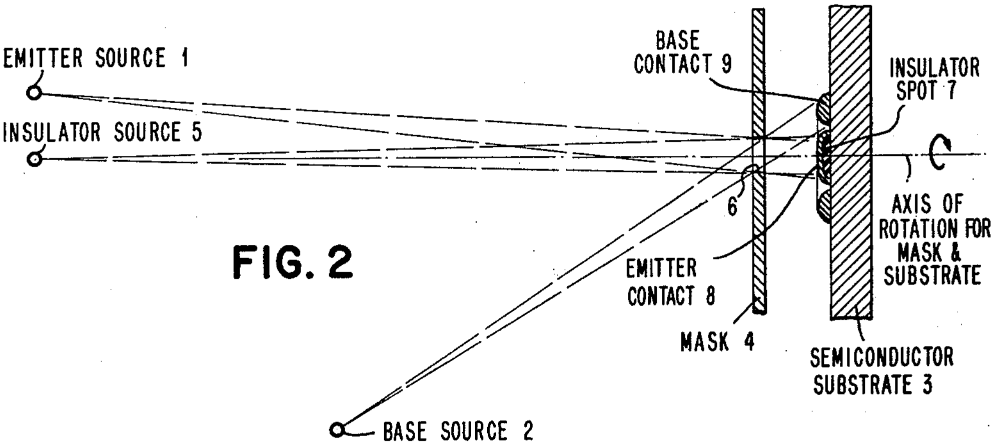
FIG. 2 is a sketch illustrating the method according to a first feature of the present invention.

Referring now to FIG. 2, the method according to a first feature of the present invention is schematically illustrated. An emitter source labelled 1 and a base source labelled 2 are employed, and semiconductor substrate 3 and mask 4 are positioned at a predetermined distance from the emitter source 1 and base source 2 However, in the arrangement according to the first feature of the present invention, an insulator source 5, constituted of silicon oxide or similar material, is positioned on the axis of rotation for the mask and substrate. The emitter source 1 is situated slightly off axis on one side of the insulator source, and the base source 2 is situated at a considerable angle off axis on the other side of the insulator source.

The procedure is to first permit the insulator source material to be projected through the aperture 6 in the mask 4, thereby to cause the deposition of an insulator spot 7 on the semiconductor substrate 3. Thereafter, the emitter and base source materials are projected through the aperture 6. Due to the fact that the emitter source is slightly off axis, the emitter source material will deposit in such a configuration as to overlap the previously-deposited insulator spot, as shown in FIG. 2 and labelled 8. Due to the fact that the base source 2 is off axis at a considerable angle, the base material will deposit in an annular ring configuration 9 as previously described.

Figure 3:
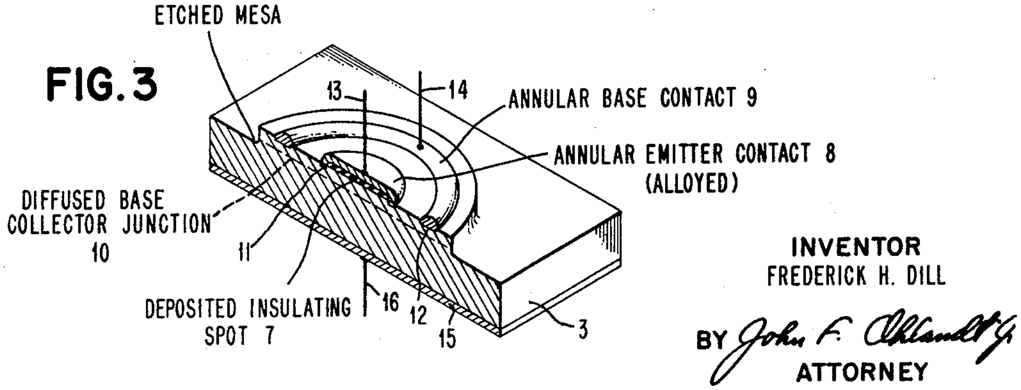
FIG. 3 is an isometric view, in section, of a structure to which contacts have been applied according to the present invention.

Referring now to FIG. 3, a cutaway view is shown of a completely fabricated transistor upon which the specialized ring and dot geometry, including the insulating spot, has been formed by the technique of the present invention. Before the deposition of the contacts and insulating spot, in accordance with a well-known procedure, the semi-conductor substrate 3 has had diffused therein a conductivity-determining impurity of such character as to cause the formation of a base-collector junction 10 as indicated in FIGURE 3.

After the deposition of the insulating spot and base and emitter contacts, the substrate 3 is heated to a sufficient temperature, typically 450° C., to cause the alloying of the impurity materials of the deposited emitter and base contacts with the semiconductor substrate. Thus, in accordance with standard alloying techniques, the portions of the top surface of the substrate 3 which are overlaid with the emitter dot and base ring depositions are dissolved so that the impurity is incorporated in the recrystallized zones which are formed when the substrate 3 is cooled down. Since the emitter contact is meant to be a rectifying contact, the impurity present will be selected to cause conversion of the surface layer in the alloying step to the opposite type of conductivity as shown at 11. However, the base contact will be of such impurity material as to cause only a change in conductivity, not a conversion to opposite conductivity-type. Following the alloying step, the substrate 3 is etched in the active region effectively to limit the active portions of the device. This etched mesa contour is indicated in FIG. 3. Thereafter, in accordance with standard practice, such as by thermo-compression bonding, electrical leads 13 and 14 are attached to the respective emitter and base contacts 8 and 9. An ohmic contact 15 is now attached to the opposite surface of the substrate 3 which thus forms contact to the collector bulk of the semiconductor substrate. This ohmic contact to the collector is labelled 15, and an electrical lead 16 is attached to the ohmic contact 15.

Figure 4A:
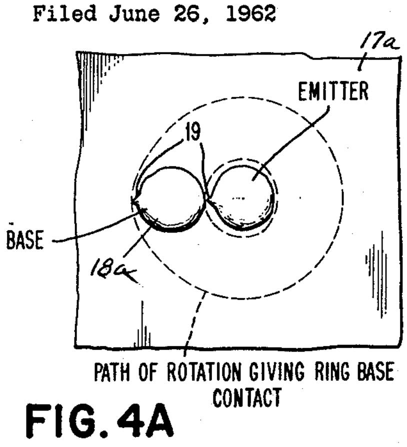
FIGS. 4A and 4B are views of base-emitter configuration images due to an imperfect mask and a perfect mask respectively.
Figure 4B:
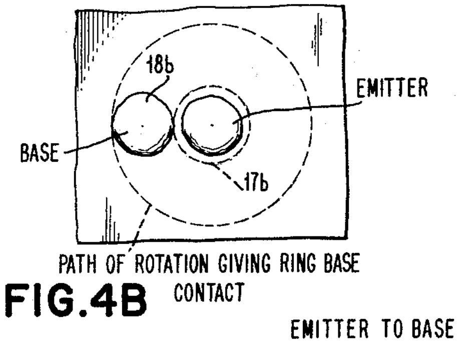

Referring now to FIGS. 4A and 4B, examples are shown therein of the images obtained with the use of an imperfect mask, as in FIG. 4A, and a perfect mask, as in FIG. 4B. Assuming that there is a slight edge defect in the mask aperture of the prior-art arrangement of FIG. 1, there will be produced at a given instant of time the image **17*a* for the emitter deposition and the image 18*a* for the base deposition as shown in FIG. 4A. It will be noted that the adjacent edges of the emitter and base contacts are formed by opposite edges of the mask and, hence, the images of the base and emitter contacts will have the proturberances 19** on non-adjacent edges as shown.

For successive instants of time, the path of rotation will be as indicated in FIG. 4A for the imperfect, or irregular, mask situation. At a typical time, for example when the mask and substrate have been rotated 180° from the position in FIG. 1, the protuberances in the images **17*a* and 18*a*** will be determined by a slight defect in the mask which is now displaced 180° from its original position. Therefore, with the exermplary images illustrated in FIG. 4A, there is distortion in the path of rotation for the base contact formation and, thus, the right-hand portion of the annular ring shown dotted is distorted. The spacing between the emitter and base contacts is thereby varied, as indicated by the interior dotted circle.

Referring now to FIG. 4B, the images **17*b* and 18*b*** for the emitter and base contacts respectively are shown similar to the showing in FIG. 4A. However, in FIG. 4B, it is assumed that the mask is perfect and, hence, there is no distortion in the annular ring configuration for base contact formation. However, there are still tolerance problems even though the mask is perfect, because any differences in the diameter of the aperture in the mask, or small difference in spacing of the mask and substrate, will cause the emitter-to-base spacing to either increase or else overlap.

Figure 5:
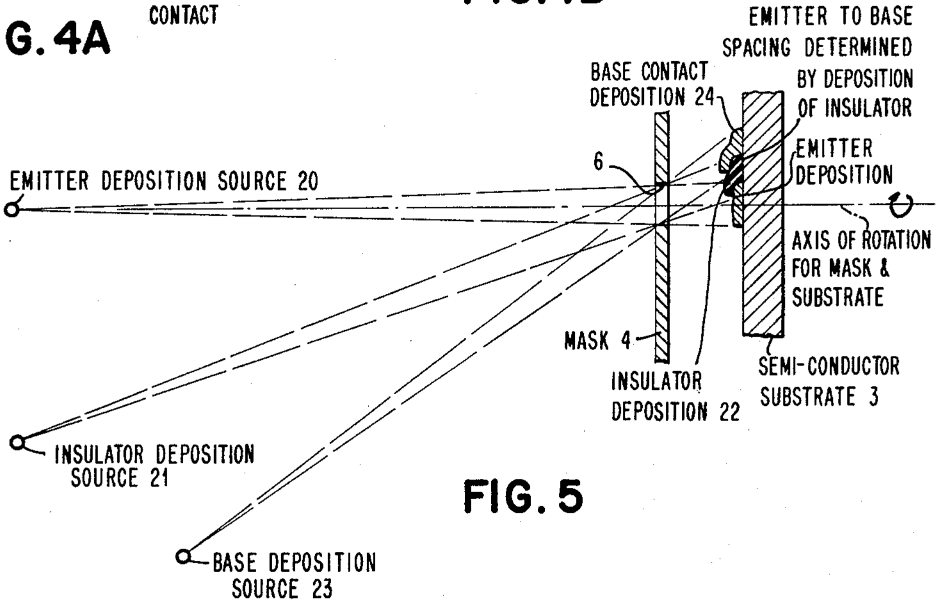
FIG. 5 is a sketch, including a ray diagram, of a ring and dot evaporation method according to a second feature of the present invention.

Referring now to FIG. 5, another technique in accordance with the present invention is illustrated for overcoming the aforesaid tolerance problems due to irregular masks, improper spacing of mask and substrate or difference in diameter of mask apertures. In accordance with this second feature, use is made of an inert insulating layer which is evaporated. Again, a typical insulator for this purpose is silicon oxide.

In FIG. 5 the emitter source 20 is shown on or near the axis of rotation, and this corresponds roughly with the situation in FIG. 1 of the prior art. However, the insulating source 21 is positioned slightly off axis and, thus, an insulating layer 22 is deposited so as to overlap the previously-deposited emitter contact, and, due to the greater angle off axis, the deposition of the insulator extends beyond the deposition of the emitter. Following this, the base source 23 is evaporated from a position still farther off axis and the base contact 24 is deposited so as to overlap the insulator deposition and even if necessary to partly overlap the emitter contact. The base contact is insulated from the emitter by the previously-deposited insulator. The second and third steps in the previously-described procedure, that is depositions of the insulator and base materials, are done while the masks and the substrate are rotated together. Likewise, the first step of the operation, that is, the deposition of the insulator, could also be done while rotating the mask and substrate.

It will be appreciated that the insulating layer 22 laid down in accordance with the techniques of FIG. 5 determines the spacing between the emitter and base contacts, rather than the spacing being determined by the respective imaging of base and emitter depositions, which was the case illustrated in FIG. 4A which resulted in variable spacing between the base and emitter contacts. It will be noted in FIG. 5 that the position of the insulating layer 22 is related to the same edge of the mask as the emitter deposition. This means, of course, that the irregularities in the mask shape and size, as previously noted, will have little effect on the emitter-to-base spacing; correspondingly, the spacing between the mask and substrate is not nearly so critical.

Figures 6, 7:
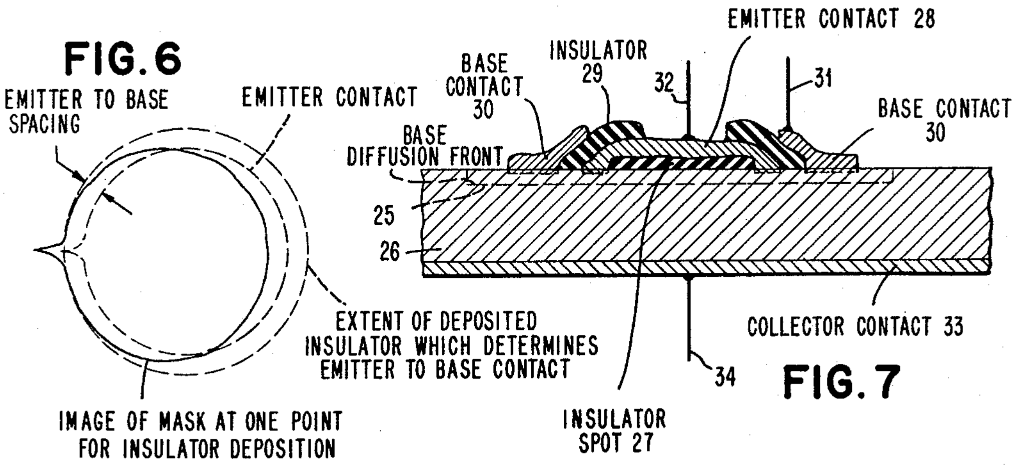
FIG. 6 is a view showing the limited effect of mask irregularities on the emitter-to-base spacing when the method illustrated in FIG. 5 is employed.
FIG. 7 is a cross-section of a transistor structure with a ring emitter and ring base contact made by another method which combines both features of the present invention.

Reference to FIG. 6 will confirm the fact that, even though there is an edge defect in the mask aperture, as was also the case graphically portrayed in FIG. 4A, the extent of the deposited insulator, following the technique of FIG. 5, will be affected in the same manner as the extent of the emitter contact deposition since the extent of both is being determined at all times by the same edge of the mask.

It is to be noted that changes in mask size change the diameter of the emitter and the extent of the overlap of the emitter and base contacts, but this does not affect the emitter-to-base spacing at all.

The several techniques that have been separately illustrated in FIGS. 2 and 5 may be combined so as to produce the transistor structure illustrated in FIG. 7. Thus, both features of the present invention are utilized together, that is, an insulator spot is initially laid down in accordance with the technique of FIG. 2 whereby the insulator source 5 is positioned on or near the axis of rotation. Thereafter, the emitter contact deposition takes place with the emitter source 1 positioned only very slighly off the axis of rotation as illustrated in FIG. 2. Then, the same insulator source, or a different one, if desired, is used as illustrated in FIG. 5. The last step is to lay down the base contact in accordance with the technique of FIG. 5. Thus, the structure of FIG. 7 is realized by combining the initial insulator spot deposition and the emitter deposition as exemplified by FIG. 2 with a later insulator deposition and base contact deposition as performed in accordance with the technique of FIG. 5.

The transistor structure of FIG. 7 is obtained similar to the manner in which the completed transistor configuration of FIG. 3 was obtained. That is, a base collector junction 25 is initially formed by diffusion of a suitable impurity into the bulk of the crystal 26. The insulator spot 27 is that formed in accordance with the first step of the technique of FIG. 2, and the emitter contact 28 is that formed by the second step of the same technique. The second insulator deposition, labelled 29, formed in accordance with the technique of FIG. 5, is shown partly overlapping the emitter contact 28 on each side and effectively determining the spacing between emitter and base of this transistor by the actual contact made with the surface of the crystal 26. The insulator deposition 29 is so formed that an opening for attachment of an electrical conductor remains. The base contact 30, as formed by the technique of FIG. 5, partly overlaps the previously-deposited materials and extends beyond the insulator 29 and makes contact with the surface of the semi-conductor crystal 26.

In accordance with the standard procedure referred to in connection with FIG. 3, portions of the emitter contact 28 and base contacts 30 are thereafter alloyed to the semiconductor crystal 26. A collector contact 31 is affixed to the lower surface of the crystal 26, and electrical leads 32, 33 and 34 are attached to the respective emitter, base and collector contacts in a well-known manner.

Although in the several embodiments of FIGS. 2 and 5 the formation of a single transistor unit has been shown, it will be apparent to those versed in the art that, with the procedures previously outlined, an array of separate transistor devices may be formed upon the substrate. The devices formed on a typical substrate of germanium 200 mils square could number approximately 100, with 20 mil spacing between the individual units. The distances involved in fabricating transistors in accordance with the present invention are on the order of 5 inches for the separation between the various source materials and the substrate, and on the order of 10 mils for the separation between the mask and substrate. As mentioned heretofore, the mask aperture is usually on the order of 1 mil in diameter.

While the invention has been particularly shown and described with reference to preferred embodiments thereof, it will be understood by those skilled in the art that various changes in form and details may be made therein without departing from the spirit and scope of the invention.

What is claimed is:

1. A process of fabricating a semiconductor device wherein contacts are deposited onto a surface of a semiconductor substrate through a mask situated adjacent said substrate, comprising the steps of:
   initially evaporating through the mask an insulator source material disposed a predetermined distance from the mask-substrate combination so as to form an insulating spot on one surface of said substrate;
   evaporating an emitter source material through the mask so as to form an emitter dot contact deposition which entirely overlays the previously-deposited insulating spot and makes actual contact with said one surface of said substrate along the rim of the deposition formed, thereby to produce a large area emitter contact for later attachment of leads but a limited capacitance-contributing area of contact with said substrate; and
   evaporating a base source material from a position removed from said emitter source material and through said mask onto said one surface of said substrate in an annular configuration concentrically spaced from said emitter dot contact.

2. A process of fabricating a transistor wherein emitter and base contacts are deposited onto one surface of a semiconductor substrate through a small aperture in a mask disposed a short distance from said substrate, comprising the steps of:
   initially evaporating through the mask an insulator source material disposed a predetermined distance from the mask-substrate combination so as to form an insulating spot on one surface of said substrate;
   rotating the mask-substrate combination on a common axis of rotation;
   evaporating an emitter source material through said mask from a position slightly off the axis of rotation of said mask-substrate combination so as to form an emitter dot contact deposition which entirely overlays the previously-deposited insulating spot and makes actual contact with said one surface of said substrate along the rim of the deposition formed, thereby to produce a large area emitter contact for later attachment of leads but a limited capacitance-contributing area of contact with said substrate; and
   evaporating a base source material from a position removed from said emitter source material and through said mask onto said one surface of said substrate in an annular configuration concentrically spaced from said emitter dot contact.

3. The process defined in claim 1
   wherein, prior to the formation of the base and emitter contacts, an impurity is diffused a predetermined distance into said surface of said substrate, thereby to create a thin base region and a collector region within said substrate; and
   wherein, after the deposition of said base and emitter contacts, etching the substrate surface to restrict the active area of the device.

4. The process defined in claim 3
   wherein the base contact material and the emitter contact material that are deposited are alloyed to the semiconductor substrate; thereby forming, respectively, an ohmic contact and a rectifying contact to said thin base region;
   forming an ohmic collector contact to the opposite surface of said substrate; and attaching electrical leads to the respective base, emitter and collector contacts.

5. A process of fabricating a transistor wherein emitter and base contacts are made to a semiconductor substrate by evaporating emitter and base source materials through an aperture in a mask situated adjacent said substrate and wherein the substrate and mask are rotated together, comprising the steps of:

initially evaporating through the mask an emitter source material so as to form a dot-like emitter deposition on one surface of said substrate;

evaporating through said mask an insulator source material so that the deposited insulator material partly overlaps the dot-like emitter deposition and makes actual contact with the semiconductor surface in a restricted portion, said restricted portion defining the spacing between the base and emitter of the finally-formed transistor; and evaporating through the mask a base source material so as to overlap the previously-deposited material and to make actual contact with said surface in another restricted portion.

6. A process of fabricating a transistor wherein emitter and base contacts are made to a semiconductor substrate by evaporating emitter and base source materials through an aperture in a mask and wherein the substrate and mask are rotated together, comprising the steps of:

positioning an emitter evaporation source approximately on the axis of rotation for the mask-substrate combination;

positioning an insulator source slightly off-axis and a base evaporation source further off-axis;

first depositing the emitter source material in a dot-like configuration on said substrate;

depositing the insulator source material from the off-axis insulator source so that the deposited insulator material partly overlaps the emitter deposition and contacts the semiconductor surface in a restricted area;

depositing the base material from the source which is further off the axis so as to overlap the previously-deposited insulator material and to make actual contact in another restricted area on said surface.

7. The process defined in claim 6 wherein, prior to the formation of the base and emitter contacts, an impurity is diffused a predetermined distance into said surface of said substrate, thereby to create a thin base region within the semiconductor substrate; and after the deposition of said base and emitter contacts, etching the substrate surface to restrict the active area of the transistor.

8. The process defined in claim 7 wherein the base contact material and the emitter contact material that are deposited are alloyed to the semiconductor substrate, thereby, respectively, forming an ohmic contact and a rectifying contact to the base region;

forming an ohmic collector contact to the opposite surface of said substrate; and attaching electrical leads to the respective base, emitter and collector contacts.

9. The process of fabricating a semiconductor structure wherein emitter and base contacts are formed on a surface of a semiconductor substrate by evaporating emitter and base source materials through an aperture in a mask situated adjacent said substrate and wherein said substrate-mask combination are rotated together, comprising the steps of:

first depositing insulator material from an insulator source located near the axis of rotation of said mask-substrate combination so as to deposit an insulator spot on the surface of said substrate;

depositing an emitter contact from an emitter source which is positioned slightly off the axis from the position of said insulator source so that the depositing emitter contact is formed to overlay completely the previously-deposited insulator spot and to contact the surface of said semiconductor substrate;

thereafter depositing insulator material from a source which is positioned further off the axis than the emitter source, thereby to partly overlay said deposited emitter contact and to make actual contact with said surface in a restricted portion which effectively determines the spacing between the finally-formed emitter and base of said semiconductor structure; and depositing a base contact from a source positioned further off-axis than said last-named insulator source so as to partly overlay said previously-deposited insulator and to make actual contact with the surface of said substrate in another restricted portion.

10. The process defined in claim 9 wherein, prior to the formation of the base and emitter contacts, an impurity is diffused a predetermined distance into said surface of said substrate, thereby to create a thin base region within the semiconductor substrate; and after the deposition of said base and emitter contacts, etching the substrate surface to a predetermined depth to restrict the active area of the device.

11. The process defined in claim 10 wherein the base contact material and the emitter contact material that are deposited are alloyed to the semiconductor substrate, thereby forming, respectively, an ohmic contact and a rectifying contact to the base region;

forming an ohmic collector contact to the opposite surface of said substrate; and attaching electrical leads to the respective base, emitter and collector contacts.

References Cited by the Examiner

UNITED STATES PATENTS

| | | | |
|---|---|---|---|
| 2,858,489 | 10/58 | Henkels. | |
| 2,875,505 | 3/59 | Pfann. | |
| 2,952,896 | 9/60 | Cornelison. | |
| 2,953,730 | 9/60 | Pankove | 29—25.3 X |
| 2,981,877 | 4/61 | Noyce | 148—1.5 X |
| 3,044,147 | 7/62 | Armstrong | 29—25.3 |

RICHARD H. EANES, Jr., *Primary Examiner.*